United States Patent [19]
Yoo et al.

[11] Patent Number: 5,657,265
[45] Date of Patent: Aug. 12, 1997

[54] SEMICONDUCTOR MEMORY DEVICE HAVING CIRCUIT ARRAY STRUCTURE FOR FAST OPERATION

[75] Inventors: Jei-Hwan Yoo; Jung-Hwa Lee, both of Suwon, Rep. of Korea

[73] Assignee: Samsung Electronics Co., Ltd., Suwon, Rep. of Korea

[21] Appl. No.: 673,001

[22] Filed: Jul. 1, 1996

[30] Foreign Application Priority Data

Jun. 29, 1995 [KR] Rep. of Korea ................ 1995/18291

[51] Int. Cl.$^6$ ........................................... G11C 5/06
[52] U.S. Cl. .......................... 365/63; 365/51; 365/230.03
[58] Field of Search ........................ 365/51, 63, 230.03

[56] References Cited

U.S. PATENT DOCUMENTS

| | | | |
|---|---|---|---|
| 5,361,223 | 11/1994 | Inoue et al. | 365/51 |
| 5,363,339 | 11/1994 | Fujita | 365/230.06 |
| 5,369,619 | 11/1994 | Ohba | 365/230.03 |
| 5,499,215 | 3/1996 | Hatta | 365/230.03 |
| 5,535,153 | 7/1996 | Saeki | 365/72 |

*Primary Examiner*—David C. Nelms
*Assistant Examiner*—Hien Nguyen
*Attorney, Agent, or Firm*—Cushman Darby & Cushman, IP Group of Pillsbury Madison & Sutro LLP

[57] ABSTRACT

A semiconductor memory device includes at least four memory cell array blocks, each having an array of memory cells, row and column decoders for selecting a memory cell designated by a row and column address, an I/O line for inputting/outputting data of the memory cell array block, and an I/O driver connected to the I/O line for selectively driving data to/from a selected memory cell. A first data line transmits the data, being connected between the I/O driver of one memory cell array block and the I/O driver of another memory cell array block oppositely arranged with respect to a central portion of the semiconductor memory device. A second data line transmits the data by connecting the first data lines of at least two memory cell array blocks disposed adjacent to each other. A data sense amplifier, connected to the second data line, senses and amplifies the data, and a data output unit, connected to the data sense amplifier, outputs the amplified data to an external lead frame. Therefore, the present invention has an advantage in that a relatively small layout area in required and a relatively low amount of power is consumed.

11 Claims, 2 Drawing Sheets

SEMICONDUCTOR MEMORY DEVICE HAVING CIRCUIT ARRAY STRUCTURE FOR FAST OPERATION

BACKGROUND OF THE INVENTION

1. Field of the Invention

The present invention relates to a semiconductor memory device, and more particularly, to a memory device structure which minimizes speed delays due to skew between access times of data cells in the operation of a high-speed memory device and which reduces the size of a memory circuit array. The present application is based on Korean Application No. 18291/1995, which is incorporated herein by reference for all purposes.

2. Description of the Related Art

Generally, as capacities of semiconductor memory devices increase, in particular, capacities of dynamic RAM devices, their sizes are accordingly considerably enlarged. Meanwhile, owing to the development of process technology, the width of bus lines in such devices narrows notably, thereby increasing line loading to the memory circuits.

Nevertheless, the need for faster, lower power-consuming and higher bandwidth memory products continues to grow, and will continue to grow for the foreseeable future. To respond to such trends, various memory architectures are under development, along with diverse technologies directed to feature enhancement.

FIG. 1 shows a data path and circuit array layout in a conventional semiconductor memory. In this structure, there are provided memory cell array blocks 100; column decoders 40 disposed between two memory cell array blocks; row decoders 30 arranged toward a chip center portion of each memory cell array block; data input/output buffers 4 disposed to one side of the center of the horizontal direction of one of the memory cell array blocks 100; and data sense amplifiers and data input drivers 2 which connect each of or a plurality of data input/output lines 1 with a switching device 20. Output data lines 3 are wired to the center area of the chip and are connected to respective switching devices 20. Accordingly, data is thereby transferred to data bus 5 which is connected with data input/output buffer 4.

In such a memory structure, when memory cells at both side ends of the memory cell array block 100 are simultaneously accessed, the difference between the speeds at which data is retrieved from both cells increases in accordance with the memory chip capacity. Also, since the data sense amplifiers 2 are arranged to connect to each or a plurality of the data input/output lines 1 in the memory cell array block 100, the memory circuit array area increases considerably. Furthermore, when a large amount of data must be concurrently outputted in the memory cell array to implement high bandwidth, an even larger circuit array area and increased power consumption are required.

SUMMARY OF THE INVENTION

Accordingly, it is an object of the present invention to provide a memory circuit array structure which minimizes speed delays caused by skew between data retrieval from various memory cells in the operation of a high-speed memory device.

It is another object of the present invention to provide a memory circuit array structure which requires lower power consumption during circuit operation and smaller circuit array area as compared with the conventional technology in a semiconductor device implementing high bandwidth.

To achieve these and other objects, there is provided a semiconductor memory device including at least four memory cell array blocks, each having an array of memory cells, row and column decoders for selecting a memory cell designated by a row and column address, an I/O line for inputting/outputting data of the memory cell array block, and an I/O driver connected to the I/O line for selectively driving data to/from a selected memory cell. A first data line transmits the data, being connected between the I/O driver of one memory cell array block and the I/O driver of another memory cell array block oppositely arranged with respect to a central portion of the semiconductor memory device. A second data line transmits the data by connecting the first data lines of at least two memory cell array blocks disposed adjacent to each other. A data sense amplifier, connected to the second data line, senses and amplifies the data, and a data output unit, connected to the data sense amplifier, outputs the amplified data to an external lead frame. Therefore, the present invention has an advantage in that a relatively small layout area in required and a relatively low amount of power is consumed.

BRIEF DESCRIPTION OF THE DRAWINGS

A preferred embodiment according to the principles of the present invention will become better understood by reference to the following detailed description when taken together in conjunction with the attached drawings in which.

DETAILED DESCRIPTION OF THE PREFERRED EMBODIMENT

Figure 1:
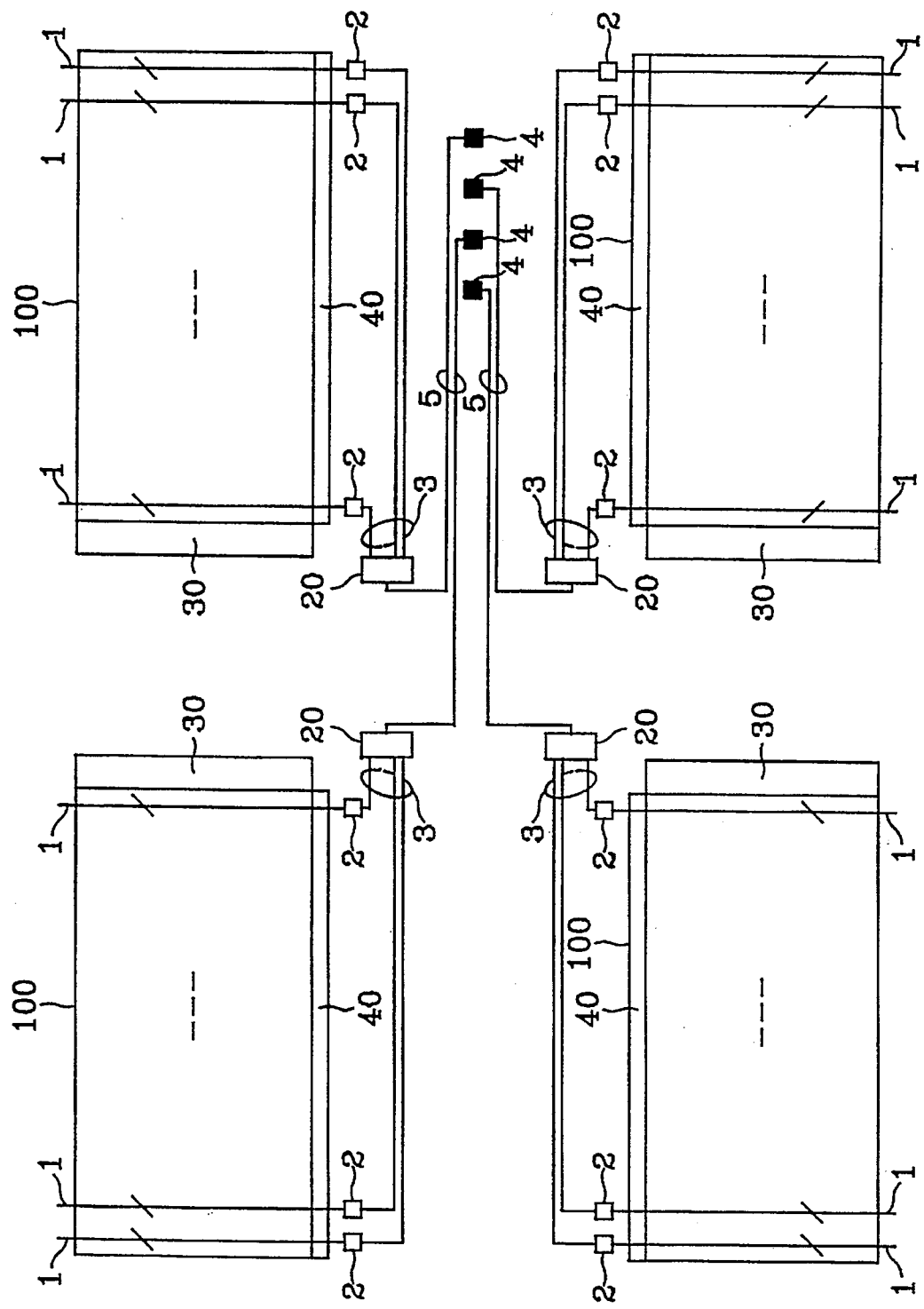
FIG. 1 is a diagram illustrating data path and circuit array layout according to the conventional technology.
Figure 2:
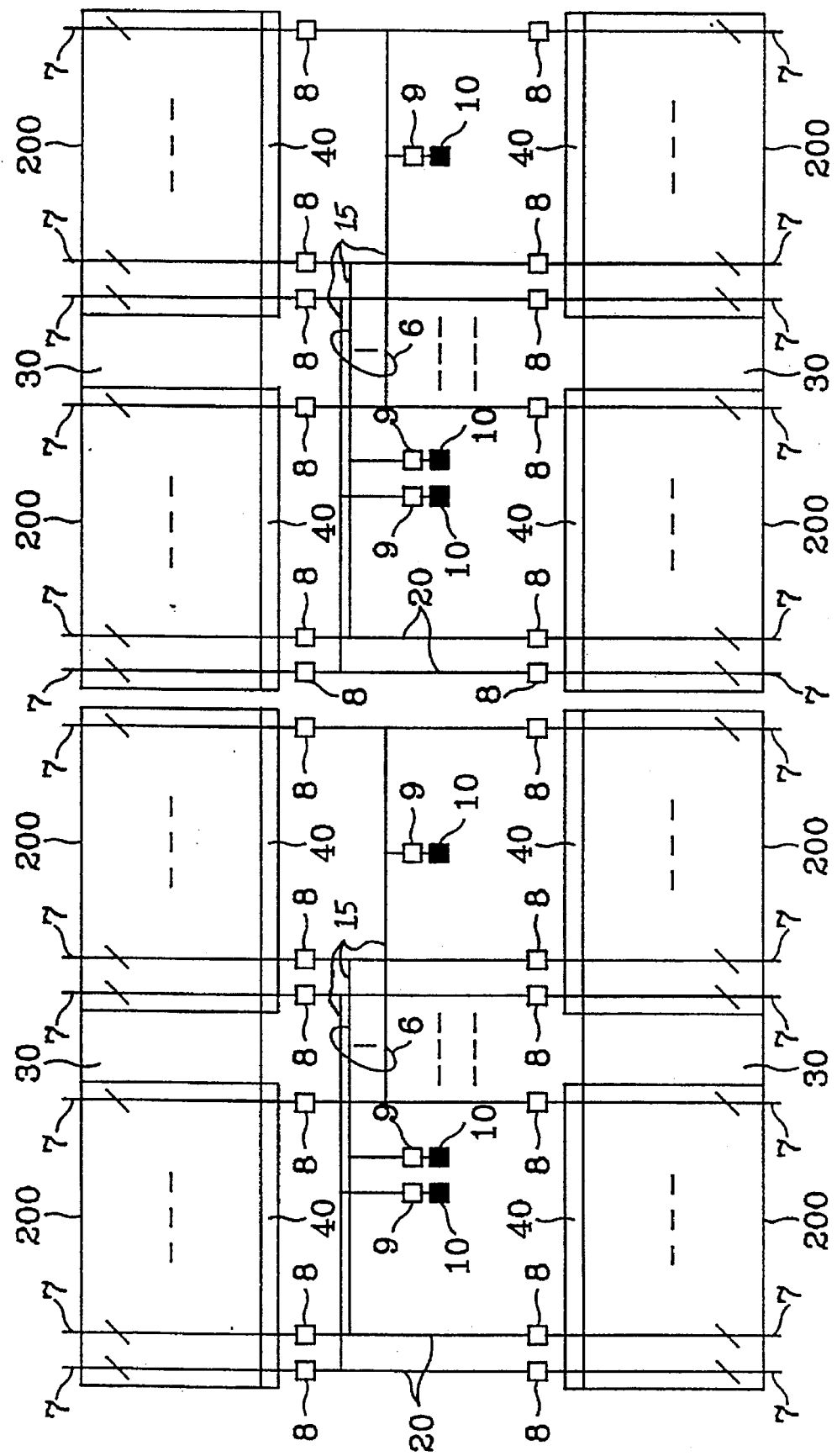
FIG. 2 is a diagram illustrating data path and circuit array layout according to the present invention.

A memory device architecture according to a preferred embodiment of the present invention is shown in FIG. 2. As shown, several memory cell array blocks 200 are provided. A row decoder 30 is provided between two memory cell array blocks to control word lines. Column decoders 40 are arranged toward the central portion of the chip of each memory cell array block to thereby limit the maximum length of data paths of vertically disposed I/O lines 7.

Preferably, at least four structures each constituted by at least adjacent two memory cell array blocks 200 sharing at least one row decoder 30 as described above are arranged around the chip central portion. At the central portion of the chip, each of the memory cell array block structures arranged on opposite sides thereof has an individual data output pad (DO), as will be described in more detail hereinbelow.

First, as compared with the conventional architecture where a data sense amplifier is connected to each I/O line, there is provided a switching device which is enabled during reading and an I/O driver which is enabled during writing in the present invention. These are both embodied by I/O switch/drivers 8 which are disposed at the same position in each opposing memory cell array block 200 and which are connected by first data lines 20.

Next, each of the memory cell block array structures includes a second data line packet 6 configured such that second data lines 15 arranged in a horizontal direction of the chip center portion are separated and displaced at constant intervals therebetween. Thus, a speed difference between data developing on each of the separate data lines 20 can be effectively minimized.

The difference between data access times at each of the data output pads is further reduced by arranging data sense amplifiers 9 and data I/O buffer/output pads 10 at central portions of each of the second data lines 15.

By thus arranging the memory cell array blocks, data from designated memory cells selected by a row address and a column address is loaded on the I/O lines 7. Then, only one I/O switch and I/O driver 8 is enabled by the address to thereby connect the I/O line 7 and the vertical first data line 20 so that the data can be transmitted to the data sense amplifier 9. Accordingly, since one data sense amplifier 9 shares four or more I/O lines 7 which are disposed in each individual memory cell array block and which are selectively connected according to address input information, the number of data sense amplifiers 9 in the entire memory chip is reduced by ¼ relative to the conventional architecture.

Since the trend in semiconductor memories is toward higher bandwidths, in such a memory device as a synchronous DRAM where a large amount of data can be read and written concurrently, the number of I/O lines arranged in the memory cell array increases considerably. As a result, an increasing number of I/O line control circuits such as I/O sense amplifiers or I/O drivers are required in accordance with the increase in I/O lines. Therefore, as for semiconductor memory devices directed toward high bandwidth, the present invention has an advantage in that a relatively small layout area and low power consumption during circuit operation can be achieved.

Therefore, it should be understood that the present invention is not limited to the particular embodiment disclosed herein as the best mode contemplated for carrying out the present invention, but rather that various substitutions and modifications can be made thereto without departing from the spirit and scope of the present invention as defined in the appended claims.

What is claimed is:

1. A semiconductor memory device comprising:
   at least four memory cell array blocks, said memory cell array blocks being arranged such that a first and a second of said memory cell array blocks are respectively disposed opposite to a third and a fourth of said memory cell array blocks with respect to a central portion of said memory device, each memory cell array block including:
   a plurality of memory cells arranged in rows and columns,
   row and column decoders which operatively select memory cells within said memory cell array block in accordance with row and column addresses, respectively,
   an I/O line which is operatively coupled to said memory cells, and
   an I/O driver connected to said I/O line, for selectively driving data on said I/O line;
   a pair of first data lines, each of said first data lines being respectively connected between said I/O driver of said oppositely disposed memory cell array blocks;
   a second data line connecting said first data lines;
   a data sense amplifier, connected to said second data line, which senses and amplifies data from a selected memory cell; and
   a data I/O pad connected to said data sense amplifier.

2. A semiconductor memory device according to claim 1, wherein said I/O driver is comprised of an I/O switch and an I/O driver.

3. A semiconductor memory device according to claim 1, wherein said data I/O pad is comprised of a data I/O buffer and a data output pad.

4. A semiconductor memory device according to claim 1, wherein said row decoder of said first and second of said memory cell array blocks is comprised of one row decoder.

5. A semiconductor memory device according to claim 1, wherein said column decoder of each of said memory cell array blocks is arranged adjacent to said central portion of said memory device.

6. A semiconductor memory device according to claim 1, wherein said first data lines, said second data line and said data sense amplifier are arranged such that the length of data paths between each of said I/O drivers and said data sense amplifier are substantially the same.

7. A semiconductor memory device comprising:
   at least four memory cell array blocks, said memory cell array blocks being arranged such that a first and a second of said memory cell array blocks are respectively disposed opposite to a third and a fourth of said memory cell array blocks with respect to a central portion of said memory device, each memory cell array block including:
   a plurality of memory cells,
   a decoder which operatively selects memory cells within said memory cell array block in accordance with an address, said decoder being arranged adjacent to said central portion of said memory device,
   an I/O line which is operatively coupled to said memory cells, and
   an I/O driver connected to said I/O line, for selectively driving data on said I/O line;
   a pair of first data lines, each of said first data lines being respectively connected between said I/O driver of said oppositely disposed memory cell array blocks;
   a second data line connecting said first data lines.

8. A semiconductor memory device according to claim 7, wherein said I/O driver is comprised of a data sense amplifier and a write driver.

9. A semiconductor memory device according to claim 7, further comprising a data I/O buffer and a data output pad connected to said second data line.

10. A semiconductor memory device according to claim 7, wherein said row decoder of said first and second of said memory cell array blocks is comprised of one row decoder.

11. A semiconductor memory device according to claim 9, wherein said first data lines, said second data line and said data output pad are arranged such that the length of data paths between each of said I/O drivers and said data output pad are substantially the same.

* * * * *